(12) United States Patent
Hamaguchi et al.

(10) Patent No.: US 7,777,249 B2
(45) Date of Patent: Aug. 17, 2010

(54) SEMICONDUCTOR DEVICE WITH ENHANCED SWITCHING SPEED AND METHOD FOR MANUFACTURING THE SAME

(75) Inventors: Takuya Hamaguchi, Tokyo (JP); Hideki Haruguchi, Tokyo (JP); Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 315 days.

(21) Appl. No.: 11/753,886

(22) Filed: May 25, 2007

(65) Prior Publication Data

US 2008/0173893 A1    Jul. 24, 2008

(30) Foreign Application Priority Data

Jan. 23, 2007    (JP) ............................. 2007-013099

(51) Int. Cl.
*H01L 29/74* (2006.01)
*H01L 29/43* (2006.01)

(52) U.S. Cl. .................... 257/133; 257/138; 257/139

(58) Field of Classification Search ................. 257/133, 257/138, 139, E21.383, E21.384, E21.385, 257/E29.198, E29.2, E29.201
See application file for complete search history.

(56) References Cited

U.S. PATENT DOCUMENTS 5,569,941 A * 10/1996 Takahashi .................... 257/133
5,981,981 A * 11/1999 Takahashi .................... 257/133

2005/0035405 A1    2/2005   Mauder et al.
2005/0253169 A1   11/2005   Suekawa

FOREIGN PATENT DOCUMENTS

| DE | 696 10 970 T 2 | 6/2001 |
|---|---|---|
| DE | 103 02 628 A1 | 12/2003 |
| DE | 103 30 571 A1 | 2/2005 |
| DE | 10 2005 021 249 A1 | 12/2005 |
| EP | 0 779 662 B1 | 11/2000 |
| JP | 9-121052 | 5/1997 |

OTHER PUBLICATIONS

Akio Nakagawa, et al., "MOSFET-mode Ultra-Thin Wafer PTIGBTs for Soft Switching Application—Theory and Experiments," Proceedings of 2004 International Symposium on Power Semiconductor Devices & ICs, Kitakyushu, pp. 103-106.

* cited by examiner

*Primary Examiner*—Hung Vu
(74) *Attorney, Agent, or Firm*—Oblon, Spivak, McClelland, Maier & Neustadt, L.L.P.

(57) ABSTRACT

A method for manufacturing a semiconductor device according to the present invention has a step of forming a plurality of MOSFETs each having a channel of a first conductivity type in a stripe on the first major surface of a wafer; a step of implanting an impurity of a first conductivity type into the second major surface of the wafer, and performing a laser annealing treatment in a stripe leaving equidistant gaps, to form a buffer layer that has been activated in a stripe; a step of implanting an impurity of a second conductivity type into the second major surface of the substrate after forming the buffer layer, and performing a laser annealing treatment on the entire surface of the second major surface, to form a collector layer, and to activate the buffer layer; and a step of forming an emitter electrode on the first major surface, and forming a collector electrode on the second major surface.

3 Claims, 6 Drawing Sheets charged particles

SEMICONDUCTOR DEVICE WITH ENHANCED SWITCHING SPEED AND METHOD FOR MANUFACTURING THE SAME

BACKGROUND OF THE INVENTION

1. Field of the Invention

The present invention relates to a method for manufacturing an insulated gate bipolar transistor (IGBT) of a light-punch-through type, and more specifically, to a method for manufacturing a semiconductor device that can prevent the lowering of destruction resistance in short-circuit test, and can elevate the switching speed while suppressing the fluctuation of ON voltages, and a method for manufacturing such a semiconductor device.

2. Background Art

An insulated gate bipolar transistor (IGBT) is widely used in power converters, such as inverters. The total loss when in IGBT is operated can be expressed by the total of steady loss determined by ON voltage and switching losses determined by the turn-on speed and the turn-off speed. To obtain a compact IGBT of a high cost performance, the total loss must be reduced. Therefore, efforts for lowering the total loss have been carried out by miniaturizing a surface MOSFET, converting a planar structure to a trench structure, or optimizing carrier distribution in the vertical direction.

IGBTs are driven at various frequencies depending on the uses, and it is also important for lowering total loss that the ON voltages and switching speeds are controlled to suite driving frequencies. For example, when an IGBT is driven at a high frequency, the proportion of steady loss in the total loss is lowered, and the proportion of switching loss is elevated. In this case, in order to lower the total loss, it is required to design an element having a high switching speed even if the ON voltage is somewhat high.

In IGBTs of the same MOS structure or cross-sectional structure, ON voltages and switching speeds are in a trade-off relation. Specifically, when ON voltage is lowered, the switching speed is also lowered, and when ON voltage is elevated, the switching speed is also elevated. The methods for controlling these are roughly classified into two methods. One is a method wherein the life time in the IGBT is controlled by radiating electron beams, protons, or helium ions (for example, refer to Japanese Patent Application Laid-Open No. 9-121052). The other is a method wherein the concentrations in the P-collector layer and the N-buffer layer on the back face are controlled to change the injecting efficiency of holes injected from the P-collector layer into the $N^-$-drift layer in the ON state.

IGBTs can be classified into a punch-through type using an epitaxial wafer as the material, a non-punch-through type using a floating-zone wafer as the material, and a light-punch-through type that is an intermediate structure between them. Of these structures, recently, the light-punch-through type IGBTs, which have low material costs and excellent performances, have been actively developed.

FIG. 15 is a sectional view showing a conventional light-punch-through type IGBT. On the upper surface of a wafer 11, a plurality of MOSFETs each having an N-channel are formed in a stripe. Specifically, a P-base layer 13 is formed on an $N^-$-drift layer 12, and an $N^+$-emitter layers 14 are formed on the surface of parts of the P-base layer 13. Trenches are formed so as to penetrate the $N^+$-emitter layers 14, and gate electrodes 16 are formed in the trenches via gate insulating films 15.

On the gate electrodes 16, insulating films 17 are formed. On the lower surface of the wafer 11, an N-buffer layer 21 is formed. On the lower surface side of the wafer 11, lower than the N-buffer layer 21, a P-collector layer 22 is formed. An emitter electrode 23 is formed on the upper surface of the wafer 11, and a collector electrode 24 is formed on the lower surface of the wafer 11.

The ON voltages and the switching speeds of the light-punch-through type IGBT is generally controlled by controlling the concentration in the P-collector layer. Specifically, the switching speed can be elevated by lowering the concentration in the P-collector layer to decrease the quantity of holes injected from the P-collector layer into the $N^-$-drift layer. However, if the injection efficiency of holes is extremely low, field intensity in the P-collector side is elevated when the IGBT is in a short-circuit state. Since the parasitic thyristor in the IGBT is easily turned on by impact ions generated by the field intensity, a problem of lowered destruction resistance is caused.

In addition, if the concentration in the P-collector layer is lowered, the fluctuation of the contact resistance between the P-collector layer and the collector electrode formed by contact to the P-collector layer increases. Therefore, the problem of the large fluctuation of the ON voltage is caused.

SUMMARY OF THE INVENTION

To solve the above-described problems, it is an object of the present invention to provide a semiconductor device wherein the lowering of destruction resistance in the short-circuit test is prevented, and the switching speed is elevated while suppressing the fluctuation of ON voltages; and to provide a method for manufacturing such a semiconductor device.

A method for manufacturing a semiconductor device according to the present invention has a step of forming a plurality of MOSFETs each having a channel of a first conductivity type in a stripe on the first major surface of a wafer; a step of implanting an impurity of a first conductivity type into the second major surface of the wafer, and performing a laser annealing treatment in a stripe leaving equidistant gaps, to form a buffer layer that has been activated in a stripe; a step of implanting an impurity of a second conductivity type into the second major surface of the substrate after forming the buffer layer, and performing a laser annealing treatment on the entire surface of the second major surface, to form a collector layer, and to activate the buffer layer; and a step of forming an emitter electrode on the first major surface, and forming a collector electrode on the second major surface.

According to the present invention, the lowering of destruction resistance in the short-circuit test can be prevented, and the switching speed can be elevated while suppressing the fluctuation of ON voltages.

Other and further objects, features and advantages of the invention will appear more fully from the following description.

DETAILED DESCRIPTION OF THE PREFERRED EMBODIMENTS

First Embodiment

Figure 1:
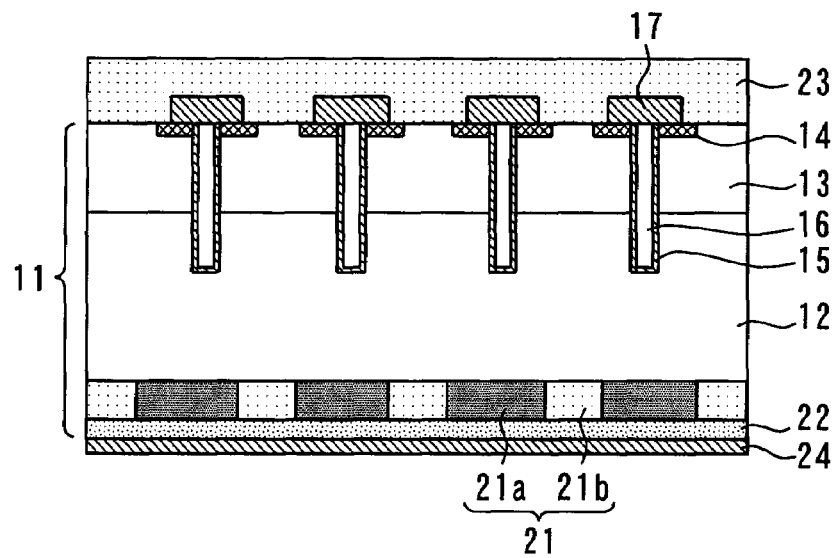
FIG. 1 is a sectional view showing a semiconductor device according to the first embodiment of the present invention.

FIG. 1 is a sectional view showing a semiconductor device according to the first embodiment of the present invention. On the upper surface (first major surface) of a wafer 11, a plurality of MOSFETs, each having an N-channel, are formed in a stripe. Specifically, a P-base layer 13 is formed on an $N^-$-drift layer 12, and an $N^+$-emitter layers 14 are formed on the surface of parts of the P-base layer 13. Trenches are formed so as to penetrate the $N^+$-emitter layers 14, and gate electrodes 16 are formed in the trenches via gate insulating films 15. On the gate electrodes 16, insulating films 17 are formed.

Figure 2:
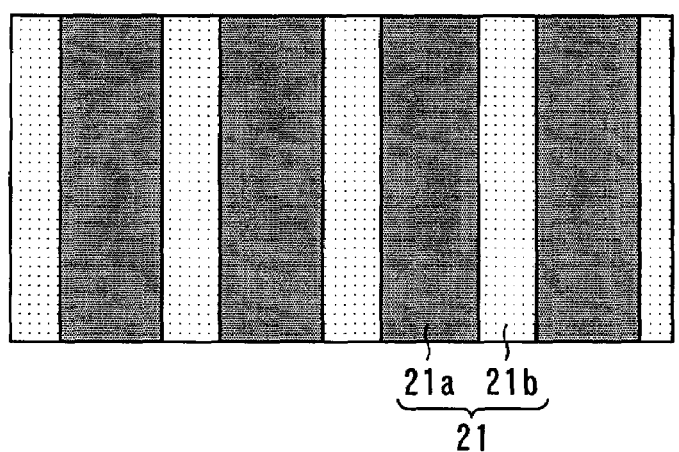
FIG. 2 is a plan view showing an N-buffer layer of a semiconductor device according to the first embodiment of the present invention.

On the lower surface (second major surface) of the wafer 11, an N-buffer layer 21 is formed. On the lower surface side of the wafer 11, lower than the N-buffer layer 21, a P-collector layer 22 is formed. An emitter electrode 23 is formed on the upper surface of the wafer 11, and a collector electrode 24 is formed on the lower surface of the wafer 11. FIG. 2 is a plan view showing an N-buffer layer of a semiconductor device according to the first embodiment of the present invention. Highly activated portions 21a and lowly activated portions 21b are alternately formed in a stripe.

Figure 3:
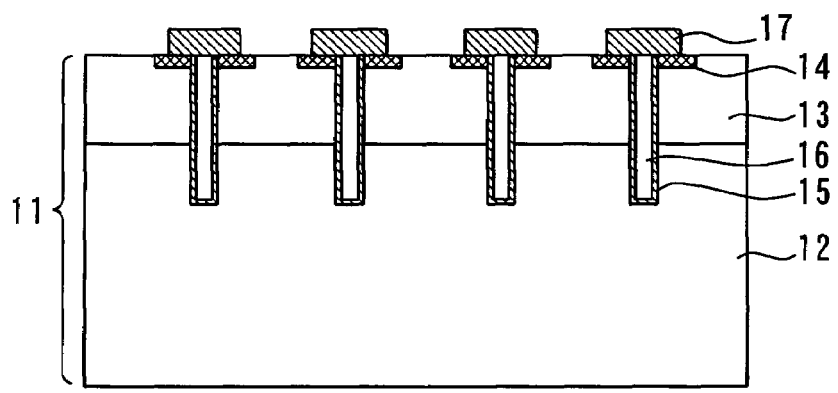
FIGS. 3-5 are sectional views for explaining a method of manufacturing a semiconductor device according to First Embodiment of the present invention.

Next, a method for manufacturing a semiconductor device according to the first embodiment of the present invention will be described referring to the drawings. First, as FIG. 3 shows, a plurality of MOSFETs, each having an N-channel, are formed in a stripe on a floating-zone wafer 11. Specifically, a P-base layer 13 is formed on an $N^-$-drift layer 12, and an $N^+$-emitter layers 14 are formed on the surface of parts of the P-base layer 13. Trenches are formed so as to penetrate the $N^+$-emitter layers 14, and gate electrodes 16 are formed in the trenches via gate insulating films 15. On the gate electrodes 16, insulating films 17 are formed.

Figure 4:
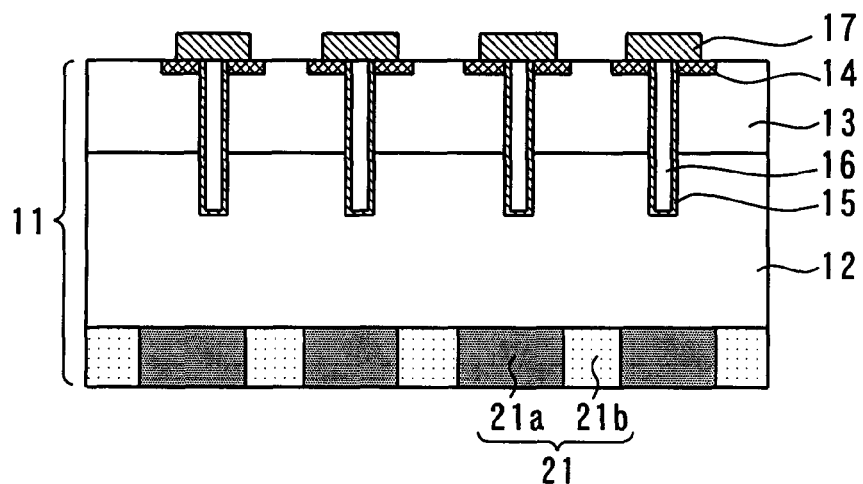

Next, as FIG. 4 shows, an N-type impurity, such as As, is implanted into the lower surface of the wafer 11. Then, a laser annealing treatment is performed in a stripe leaving equidistant gaps, to form an N buffer layer 21 that has been activated in a stripe.

Figure 5:
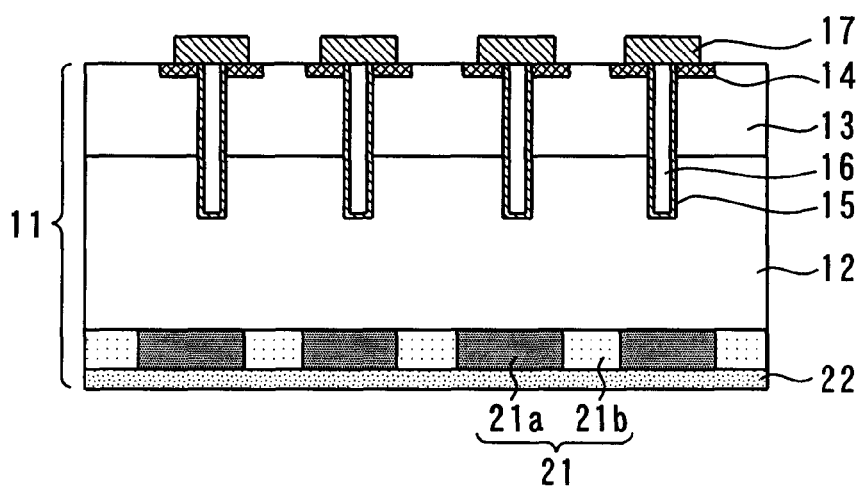

Next, as FIG. 5 shows, a P-type impurity, such as B, is implanted into the lower surface of the wafer 11. Then, P-collector layer 22 is formed and the N-buffer layer 21 is activated by performing a laser annealing treatment on the entire surface of the lower surface of the wafer 11.

Finally, an emitter electrode 23 is formed on the upper surface of the wafer 11, and a collector electrode 24 on the lower surface of the wafer 11, to form an IGBT of a light-punch-through type shown in FIG. 1.

As described above, in the first embodiment, laser annealing treatment is locally performed after implanting an N-type impurity, to alternately form highly activated portions 21a and lowly activated portions 21b in a stripe in the N-buffer layer 21. Thereby, in the highly activated portions 21a in the N-buffer layer 21, the hole implanting efficiency from the P-collector layer 22 to the $N^-$ drift layer 12 when the device is turned on can be suppressed, and the turn-off speed (i.e., switching speed) can be elevated.

In a short-circuited state, and when the field intensity in the P-collector layer 22 side is elevated, since the implantation of holes through the lowly activated portions 21b in a stripe in the N-buffer layer 21 is accelerated, and the field intensity is lowered, the lowering of destruction resistance in the short-circuit test can be prevented. Furthermore, since the highly activated portions 21a are present in the N-buffer layer 21, the implanting efficiency from the P-collector layer 22 to the $N^-$ drift layer 12 can be lowered, and the fluctuation of ON voltages can be suppressed even if the concentration in the P-collector layer 22 is not lowered.

Second Embodiment

In the first embodiment, the direction of the stripe of the highly activated portions 21a and the lowly activated portions 21b in the N-buffer layer 21 was in parallel to the direction of the stripe of a plurality of MOSFETs. In this case, to realize stable operation by equalizing carrier distribution in the IGBT when the IGBT is turned on, the distance between the highly activated portions 21a and the lowly activated portions 21b must be multiples of the stripe pitch of the plurality of MOSFETs. However, since the beam diameter of laser beams is larger than the stripe pitch of the MOSFET, the irradiation accuracy of the laser beams is tight, and realization is difficult.

Therefore, in the second embodiment, in the step of forming the N-buffer layer 21, the direction of the stripe of the regions to perform and not perform laser annealing treatment is made perpendicular to the direction of the stripe of the plurality of MOSFETs. Other steps are the same as the steps in the first embodiment.

Figure 6:
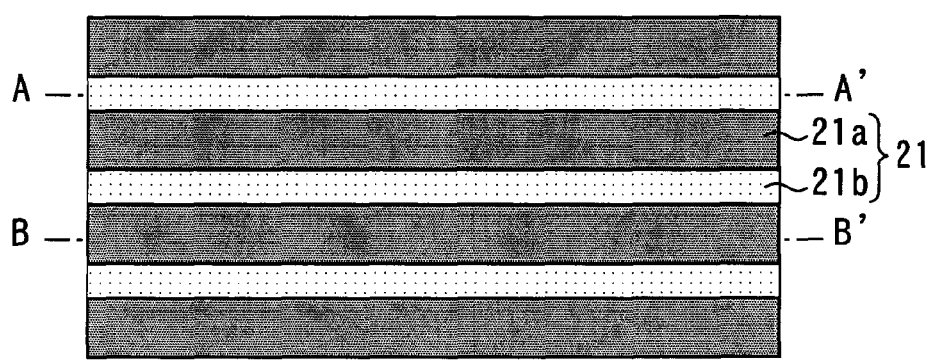
FIG. 6 is a plan view showing the N-buffer layer of a semiconductor device according to the second embodiment of the present invention.
Figure 7:
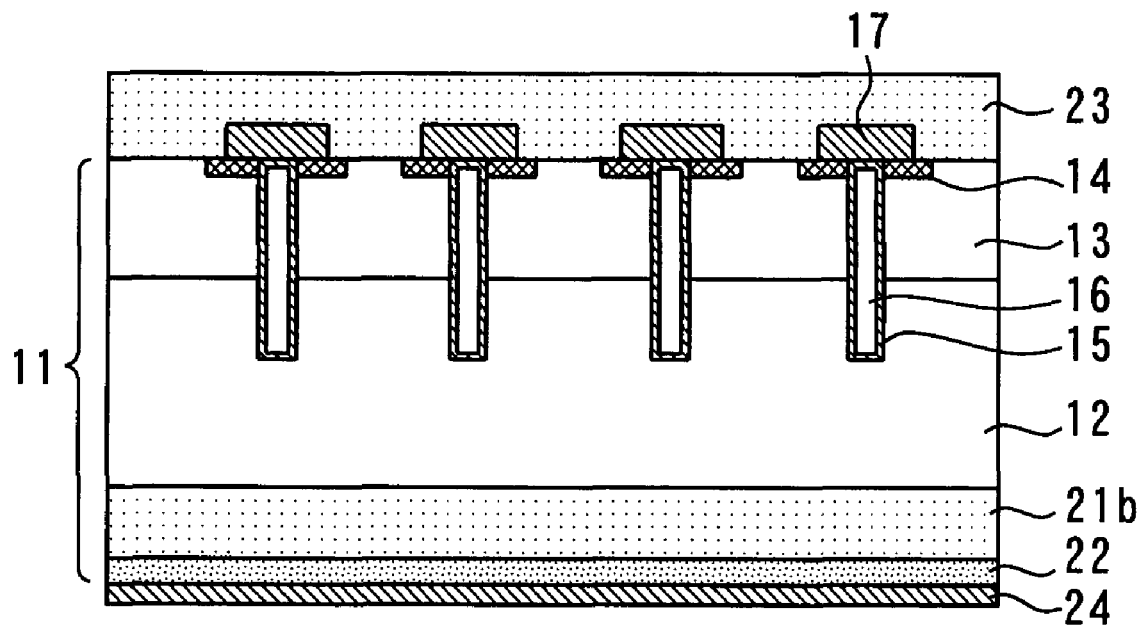
FIG. 7 is a sectional view along the line A-A' in FIG. 6.
Figure 8:
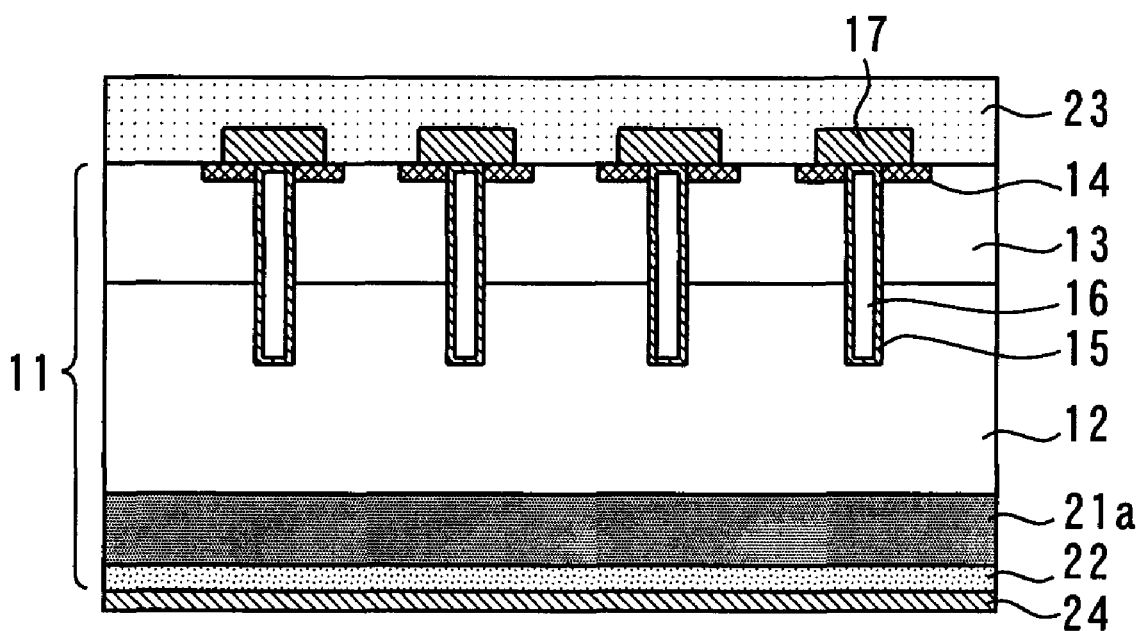
FIG. 8 is a sectional view along the line B-B' in FIG. 6.

FIG. 6 is a plan view showing the N-buffer layer of a semiconductor device according to the second embodiment of the present invention. FIG. 7 is a sectional view along the line A-A' in FIG. 6; FIG. 8 is a sectional view along the line B-B' in FIG. 6. As the drawings show, the direction of the stripes of the highly activated portions 21a and the lowly activated portions 21b in the N-buffer layer 21 is perpendicular to the direction of the stripes of the plurality of MOSFETs. Other configurations are the same as the configurations of the first embodiment.

Thereby, regardless of the distance between the regions to perform and not perform laser annealing treatment, carrier distribution in the IGBT when the IGBT is turned on can be equalized, and the stable operation as well as improvement on destruction can be realized.

Third Embodiment

Figure 9:
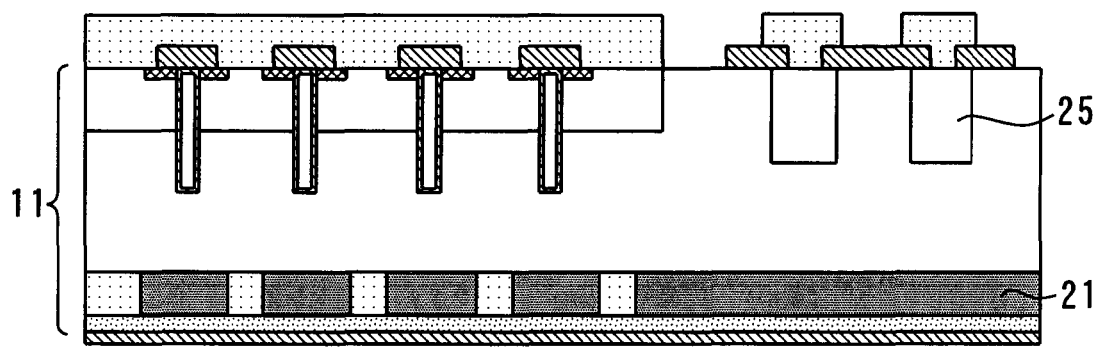
FIG. 9 is a sectional view showing a semiconductor device according to the third embodiment of the present invention.

FIG. 9 is a sectional view showing a semiconductor device according to the third embodiment of the present invention. In the circumference of the region for forming a plurality of MOSFETs, guard rings 25 (field limiting rings: FLRs) are formed on the upper surface of the wafer 11. Highly activated portions 21a are formed on the entire surface of the N-buffer layer 21 corresponding to the region for forming the guard rings 25. Other configurations are the same as the configurations of the first embodiment.

In the manufacturing process of the semiconductor device according to the third embodiment, in addition to the process of the first embodiment, guard rings 25 are formed in the circumference of the region for forming of a plurality of MOSFETs by implanting a P-type impurity, such as B on the upper surface of the wafer 11. Then, in the step of forming an N-buffer layer 21, an N-type impurity, such as As, is implanted in the entire surface of the lower surface of the wafer 11. On the region for forming an MOSFET, laser annealing treatment is performed on the lower surface of the wafer 11 in a stripe leaving equidistant gaps, to form an N buffer layer 21 that has been activated in a stripe. On the other hand, laser annealing treatment is performed on the entire surface of the region in the lower surface of the wafer 11 corresponding to the region for forming the guard rings 25. Other steps are the same as the steps in the first embodiment.

Here, when the IGBT is turned on, electrons are supplied to the $N^-$ drift layer 12 from the $N^+$ emitter layer 14 in the MOSFET through the channels. At the same time, holes are implanted from the P-collector layer 22 into the $N^-$ drift layer 12. By the implantation of holes, the resistance of the $N^-$ drift layer 12 is lowered, and the ON voltage can be lowered. The implantation of holes is accelerated not only immediately under the MOSFET, but also immediately under the guard rings 25. However, the implantation of holes into $N^-$ drift layer 12 immediately under the guard rings 25 little contributes to the lowering of ON voltage.

When the IGBT is turned off, carriers accumulated in the $N^-$ drift layer 12 are attracted to the electric field supplied between the collector and the emitter, and escape from the emitter electrode 23. However, since all the holes accumulated immediately under the guard rings 25 flow into the nearby emitter electrode 23, the density of holes is locally elevated in the IGBT. Therefore, the parasitic thyristor in the IGBT is easily turned on. If the region having a low destruction resistance is thus locally formed in the IGBT, this area is latched up in switching or turning off in the short-circuit test, and a problem of the breakdown of the IGBT is caused.

In the third embodiment, therefore, the activation rate of the N-buffer layer 21 immediately under the guard rings 25 is raised. Thereby, since the density of the holes in the $N^-$ drift layer 12 immediately under the guard rings 25 can be lowered when it is on, the destruction resistance in the transient state of turning off can be elevated.

Fourth Embodiment

Figure 10:
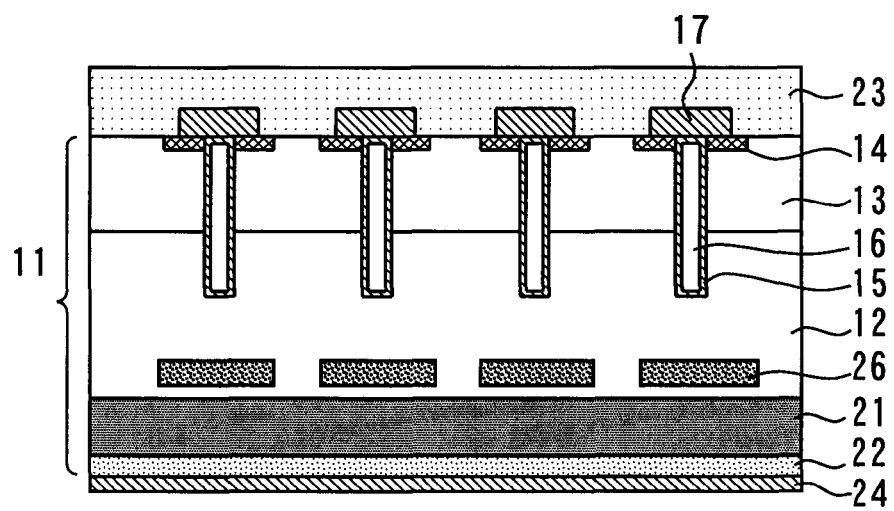
FIG. 10 is a sectional view showing a semiconductor device according to the fourth embodiment of the present invention.

FIG. 10 is a sectional view showing a semiconductor device according to the fourth embodiment of the present invention. A plurality of MOSFETs each having an N-channel are formed on the upper surface of a wafer 11 in stripe. An N-buffer layer 21 is formed on the lower surface of the wafer 11. On the lower surface side of the wafer 11, lower than the N-buffer layer 21, a P-collector layer 22 is formed. An emitter electrode 23 is formed on the upper surface of the wafer 11, and a collector electrode 24 is formed on the lower surface of the wafer 11. A lattice defect region 26 of a stripe or a mesh is formed in the $N^-$ drift layer 12 in the plurality of MOSFETs.

Figure 11:
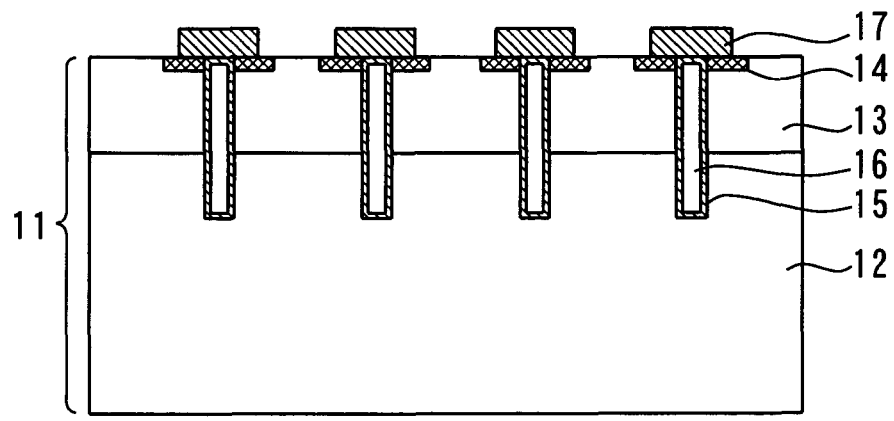
FIGS. 11-13 are sectional views for explaining a method of manufacturing a semiconductor device according to Fourth Embodiment of the present invention.

Next, a method for manufacturing a semiconductor device according to the fourth embodiment of the present invention will be described referring to the drawings. First, as FIG. 11 shows, a plurality of MOSFETs, each having an N-channel, are formed in a stripe on a floating-zone wafer 11.

Figure 12:
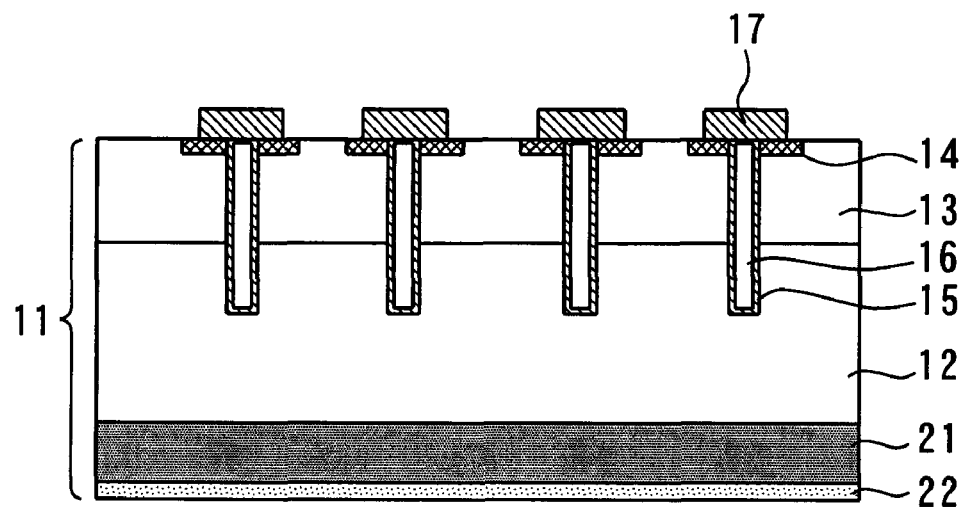

Next, as FIG. 12 shows, an N-type impurity, such as As, is implanted into the lower surface of the wafer 11 and a laser annealing treatment is performed to form an N-buffer layer 21. Then, a P-type impurity, such as B, is implanted from the lower surface of the wafer 11 and a laser annealing treatment is performed to form an P-collector layer 22.

Figure 13:
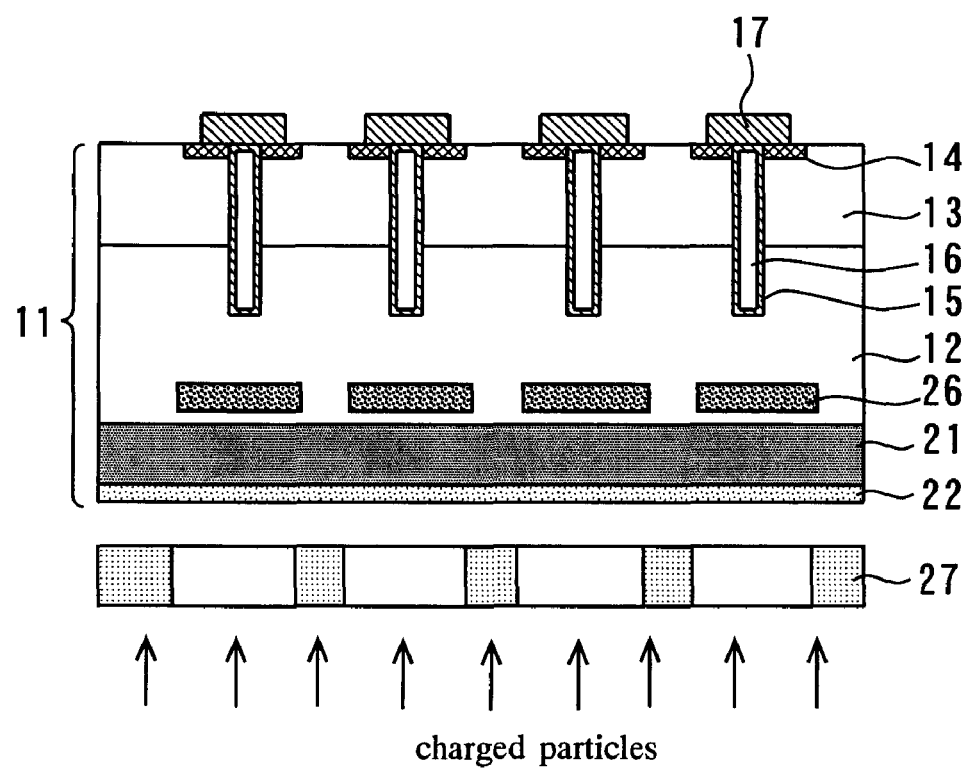

Next, as FIG. 13 shows, using a stainless-steel mask 27 having different thicknesses of Al in a stripe or a mesh, charged particles, such as protons and helium ions, are locally radiated onto the $N^-$ drift layer 12 in the plurality of MOSFETs to form a lattice defect region 26 of a stripe or a mesh. Finally, an emitter electrode 23 is formed on the upper surface of the wafer 11 and a collector electrode 24 is formed on the lower surface of the wafer 11, to form a light-punch-through type IGBT shown in FIG. 10.

Here, in order to elevate the switching speed, the dose of charged particle, such as protons and helium ions, is increased, and the life time in the vertical direction in the $N^-$ drift layer 12 is extremely shortened. However, if the dose is excessively increased, since holes from the P-collector layer 22 are not implanted into the $N^-$ drift layer 12 when the voltage between the collector and the emitter in the ON state of the IGBT is low, the IGBT functions simply as an MOSFET, and no current flows. When the voltage between the collector and the emitter is elevated, holes are implanted from the P-collector layer 22, the IGBT starts to function as an IGBT and current flows immediately. Specifically, the I-V waveform becomes a snap-back form.

In the fourth embodiment, therefore, a lattice defect region 26 of a strip or a mesh is formed in the $N^-$ drift layer 12 in the plurality of MOSFETs. Thereby, regions of an extremely short lifetime and regions of a long lifetime are alternately present in the $N^-$ drift layer 12. By forming the region having thus extremely short lifetime, the hole-implanting efficiency from the P-collector layer 22 to the $N^-$ drift layer 12 can be suppressed, and a high-speed IGBT can be realized. Even in the state wherein the voltage between the collector and the emitter is low, holes pass through the region of a long lifetime and implanted from the P-collector layer 22 into the $N^-$ drift layer 12. Thus, IGBT operation is provided, providing stable operation.

Fifth Embodiment

Figure 14:
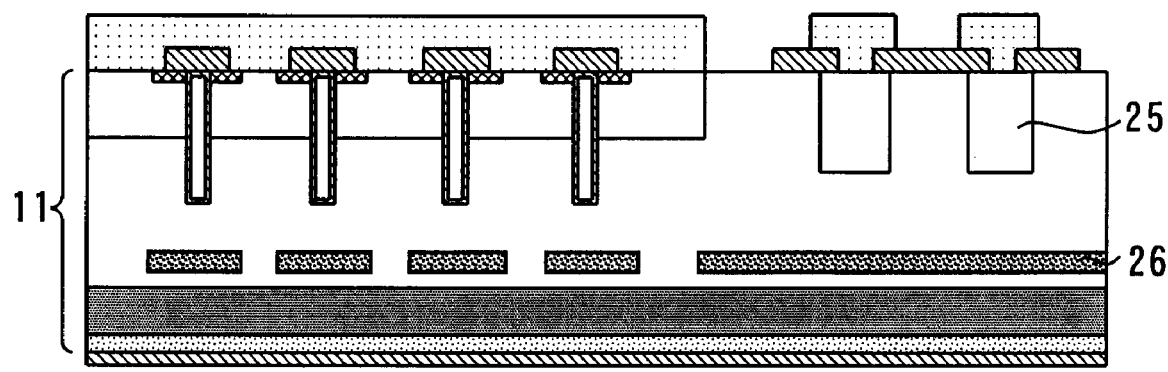
FIG. 14 is a sectional view showing a semiconductor device according to the fifth embodiment of the present invention.
Figure 15:
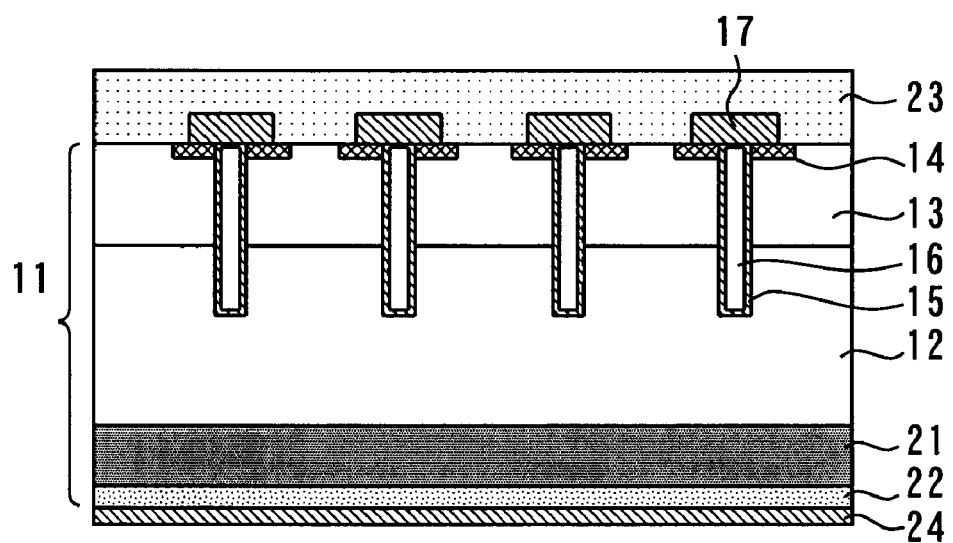
FIG. 15 is a sectional view showing a conventional light-punch-through type IGBT.

FIG. 14 is a sectional view showing a semiconductor device according to the fifth embodiment of the present invention. In the circumference of the region for forming a plurality of MOSFETs, guard rings 25 (field limiting rings: FLRs) are formed on the upper surface of the wafer 11. A lattice defect region 26 is formed on the entire surface of the $N^-$ drift layer 12 region corresponding to the region for forming the guard rings 25. Other configurations are the same as the configurations of the first embodiment.

In the manufacturing process of the semiconductor device according to the fifth embodiment, in addition to the process of the first embodiment, guard rings 25 are formed in the circumference of the region for forming a plurality of MOSFETs by implanting a P-type impurity, such as B, on the upper surface of the wafer 11. Then, in the step of forming the lattice defect region 26, charged particles are radiated on the entire surface of the $N^-$ drift layer 12 corresponding to the region for forming the guard rings 25, to form the lattice defect region 26. Other steps are the same as the steps in the first embodiment.

According to the fifth embodiment, in the same manner as in the third embodiment, the destruction resistance in the transient state of turning off can be elevated.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-013099, filed on Jan. 23, 2007 including specification, claims, drawings and summary, on which the Convention priority of the present application is based, are incorporated herein by reference in its entirety.

What is claimed is:

1. A semiconductor device comprising:
    a plurality of MOSFETs each having a channel of a first conductivity type formed in a stripe on the first major surface of a wafer;
    a buffer layer of a first conductivity type formed on the second major surface of said wafer, wherein highly activated portions and lowly activated portions are alternately formed in a stripe, an impurity concentration of the highly activated portions is the same as an impurity concentration of the lowly activated portions, an activation rate of impurities in the highly activated portions is higher than an activation rate of impurities in the lowly activated portions;
    a collector layer of a second conductivity type formed on the second major surface side of said wafer than said buffer layer;
    an emitter electrode formed on the first major surface of said wafer; and
    a collector electrode formed on the second major surface of said wafer.

2. The semiconductor device according to claim 1, wherein the direction of the stripe of the highly activated portions and lowly activated portions in said buffer layer is made perpendicular to the direction of the stripe of said plurality of MOSFETs.

3. The semiconductor device according to claim 1, further comprising a guard ring formed on said first major surface in the circumference of the region for forming said plurality of MOSFETs wherein
    said highly activated portions are formed on the entire surface of the region in said buffer layer corresponding to the region for forming said guard ring.

* * * * *